United States Patent [19]

Gullapalli et al.

[11] Patent Number: 5,825,184
[45] Date of Patent: Oct. 20, 1998

[54] ULTRA-FAST IMAGING TECHNIQUE USING K-SPACE SEGMENTATION WITH MINIMUM PHASE AND AMPLITUDE ERRORS

[75] Inventors: Rao P. Gullapalli; Mark J. Loncar, both of Richmond Heights, Ohio

[73] Assignee: Picker International, Inc., Highland Heights, Ohio

[21] Appl. No.: 638,204

[22] Filed: Apr. 26, 1996

[51] Int. Cl.[6] ........................................ G01V 3/00
[52] U.S. Cl. .................................. 324/309; 324/307
[58] Field of Search ............................ 324/309, 307, 324/300, 312, 313, 314; 128/653.2

[56] References Cited

U.S. PATENT DOCUMENTS

| | | | |
|---|---|---|---|
| 4,833,407 | 5/1989 | Holland et al. | 324/309 |
| 5,270,654 | 12/1993 | Feinberg et al. | 324/309 |
| 5,361,028 | 11/1994 | Kanayama et al. | 324/307 |
| 5,474,067 | 12/1995 | Laub | 324/309 |
| 5,485,086 | 1/1996 | Meyer et al. | 324/309 |
| 5,557,204 | 9/1996 | Lenz | 324/309 |

OTHER PUBLICATIONS

"Partial RF Echo Planar Imaging With the FAISE Method. I. Experimental and Theoretical Assessment of Artifact", Melki et al., MRM 26: 328–341 (1992).

"Partial RF Echo Planar Imaginging with the FAISE method. II. Contrast Equivalence with Spin–Echo Sequences", Melki et al., MRM 26:342–354 (1992).

"Increased Flexibility in GRASE Imaging by K–Space- –Banded Phase Encoding", Feinberg, et al., MRM 34:149–155 (1955).

"GRASE (Gradient–and Spin–Echo) MR Imaging: A New Fast Clinical Imaging Technique", Feinberg, et al. Radiology 1991; 181: 597–602

"Gradient–Echo Shifting in Fast MRI Techniques (GRASE Imaging) for Correction of Field Inhomogeneity Errors and Chemical Shift", Feinberg et al., J. Mag. Res. 97: 177–183 (1992).

"Dual Contrast GRASE (Gradient–Spin Echo) Imaging Using Mixed Bandwidth", Feinberg, et al. MRM 31: 461–464 (1994).

Feinberg et al., "Increased Flexibility in GRASE Imaging by k Space–Banded Phase Encoding", MRM 34:149–155 (1995).

Melki, et al., "Comparing the FAISE Method with conventional Dual–Echo Sequences", JMRI 1991; 1: 319–326.

Oshio, et al., Magn. Reson. Med., 20, 344 (1991).

Melki, et al., Magn. Reson. Med., 26, 328 (1992).

*Primary Examiner*—Louis M. Arana
*Attorney, Agent, or Firm*—Fay, Sharpe, Beall, Fagan, Minnich & McKee

[57] ABSTRACT

A plurality of radio frequency excitation pulses or shots (52) are applied, ten in the embodiment illustrated in FIGS. 4 and 5. Following each shot, sets of data lines are collected. In the first set, an early gradient echo (EGE1), a spin echo (SE1), and a late gradient echo (LGE1), are induced to form three corresponding data lines. Magnetization is inverted (56) and a second set of data lines are generated. In the illustrated embodiment, nine sets of data lines are generated in each repetition. Phase-encoding gradient pulses (86, 88) are applied to cause the early gradient echo, the spin echo, and the late gradient echo data lines of each set to fall offset by a third of k-space. Phase-encoding pulses (74) are applied before each set and stepped such that in half of the repetitions, the phase-encoding increases with each subsequent set. In the other half of the repetitions, the phase-encoding decreases for each subsequent set. In this manner, the first and last data line in each segment of k-space are from the same echo position with the repetition. By selecting the intermediate phase-encoding step with which to start the first set, the phase-encoding at the center of k-space is selectively adjustable such that the pseudo echo time is selectively adjustable.

17 Claims, 5 Drawing Sheets

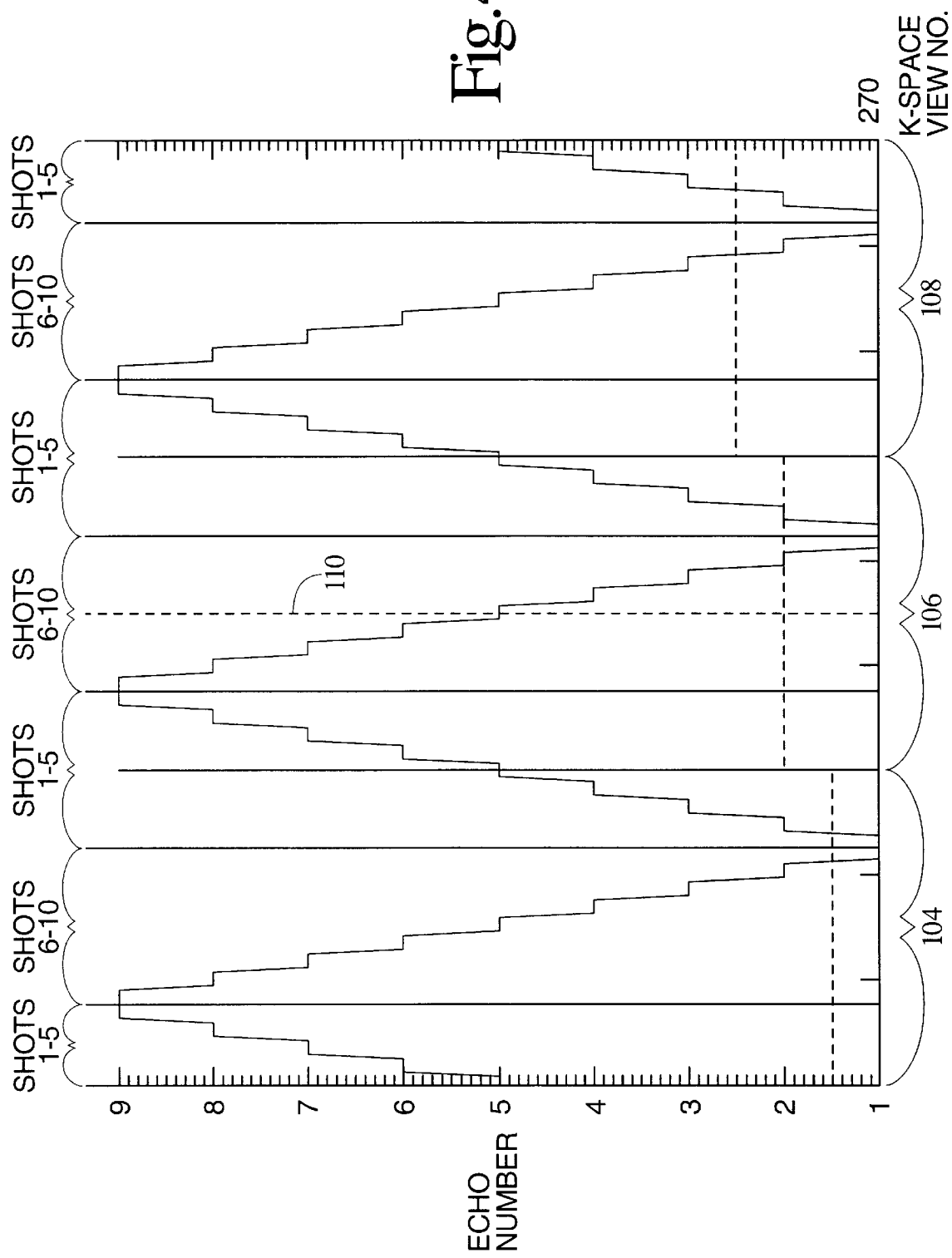

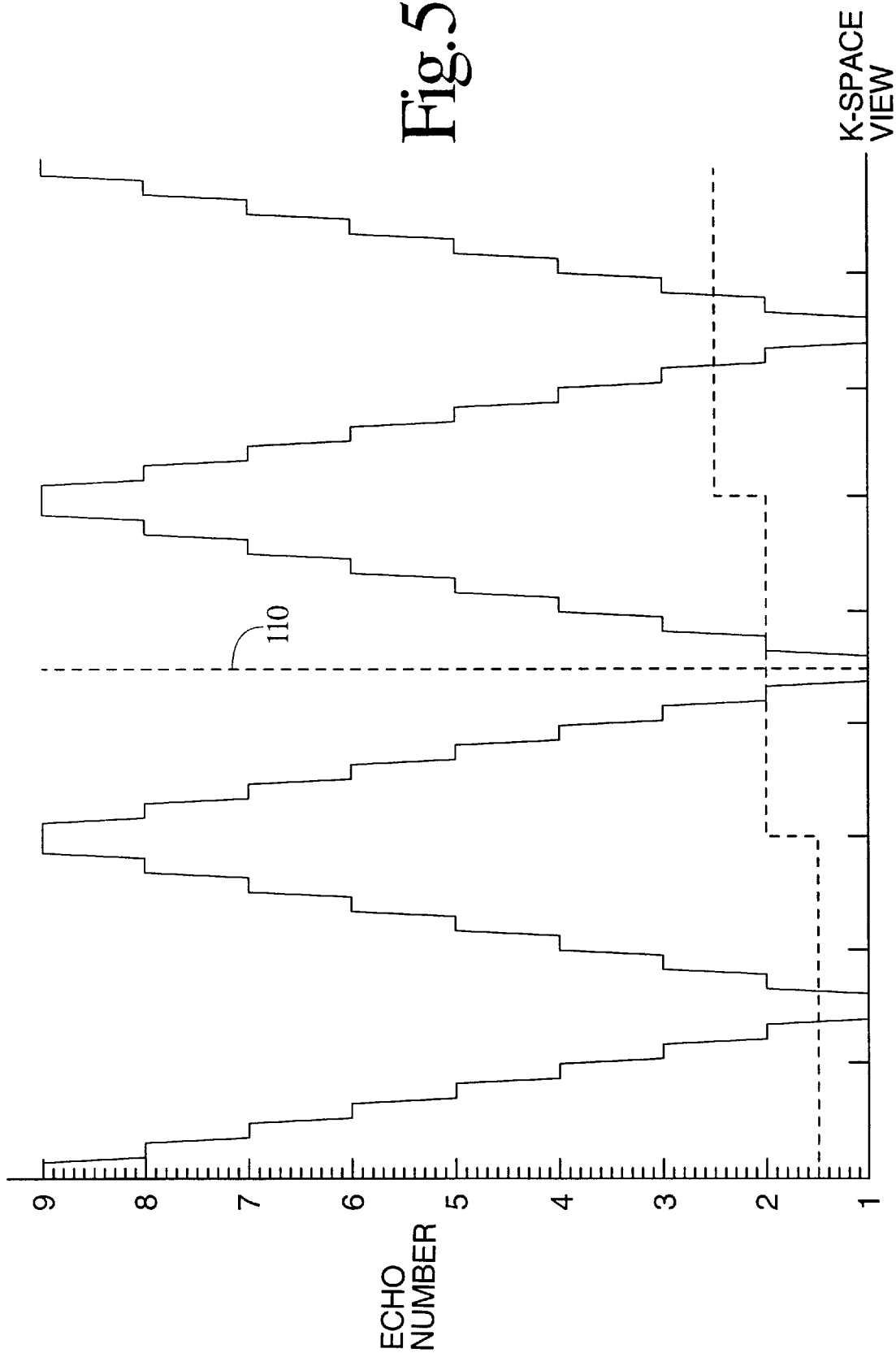

ULTRA-FAST IMAGING TECHNIQUE USING K-SPACE SEGMENTATION WITH MINIMUM PHASE AND AMPLITUDE ERRORS

BACKGROUND OF THE INVENTION

The present invention relates to the magnetic resonance arts. It finds particular application in conjunction with gradient and spin echo imaging (GSE) and will be described with particular reference thereto. However, it is to be appreciated that the present technique is also applicable to other rapid imaging sequences with repeated gradient echoes, spin echoes, or combinations of gradient and spin echoes, such as echo planar imaging (EPI), echo volume imaging (EVI) techniques, and the like.

Heretofore, magnetic resonance imaging subjects have been positioned in a temporally constant magnetic field such that selected dipoles preferentially align with the magnetic field. A radio frequency pulse is applied to cause the preferentially aligned dipoles to resonate and emit magnetic resonance signals of a characteristic resonance radio frequency. The radio frequency magnetic resonance signals from the resonating dipoles are read out for reconstruction into an image representation.

In a two-dimensional Fourier transform imaging technique, a read gradient is applied during the read out of the echo for frequency encoding along a read axis and a phase-encode gradient is pulsed to step phase-encoding along a phase-encode axis between echoes. In this manner, each echo generates a data line at a corresponding phase-encoded step in k-space. The relative phase-encoding of the data lines controls their relative position in k-space. Conventionally, the data line with zero phase-encoding extends across the center of k-space. Data lines with a phase-encoding gradient stepped in progressively positive steps are generally depicted as being above the center line of k-space; and, data lines with progressively negative phase-encoding steps are depicted as being below the center line of k-space. In this manner, a matrix, such as a 256×256 or a 512×512, etc., matrix of data values in k-space is generated. Fourier transformation of these values generates a conventional magnetic resonance image.

The magnetic resonance signal is commonly refocused into an echo. This may be done by reversing the polarity of a magnetic field gradient to induce a field or gradient echo. Analogously, the radio frequency excitation pulse may be followed with a 180° RF inversion pulse to refocus the signal as a spin echo. Moreover, by repeating the reversing of the magnetic field gradient, a series of gradient echoes can be generated following each radio frequency excitation pulse. Analogously, a series of spin echoes can be generated following each radio frequency excitation pulse by repeating the 180° radio frequency refocusing pulse. As yet another option, a single radio frequency excitation pulse can be followed by a mixture of gradient and spin echoes (GSE). See, for example U.S. Pat. No. 4,833,407 of Holland, et al.

In a traditional gradient and spin echo (GSE) imaging sequence, a radio frequency excitation pulse of arbitrary tip angle is followed by a 180° radio frequency pulse to induce a spin echo. Gradient reversals are applied before and/or after the spin echo to induce one or more gradient echoes before and/or after the spin echo. The magnetic resonance data from the object is collected during each of the gradient and spin echoes to generate a plurality of data lines or views. In addition, a series of phase-encoding gradient pulses orthogonal to the read gradient direction are applied before each echo to step the data lines through k-space. The image of the object is preferably obtained with two one-dimensional Fourier transforms of the echo data.

Traditionally, in a GSE sequence k-space is divided into three segments. The data lines of the central segment are from spin echoes. The data lines of one of the segments are from a gradient echo preceding each spin echo. The data lines from the other segment are from a gradient echo following the spin echo.

After a first set of three data lines is collected, a 180° refocusing pulse can be applied to generate another spin echo. Gradient reversals can again create preceding and following gradient echoes. Additional refocusing pulses can be applied to initiate subsequent sets of data lines following a single excitation or shot. Each first spin echo data line is placed in the central segment of k-space immediately below the first spin echo data line from the immediately preceding sequence repetition. The spin echoes following the first refocusing pulse fill the next several lines of the central portion of k-space, etc. Looking to an example in which each of 10 excitations or shots is followed by 9 refocusing pulses to generate a set of data lines, the 10 initial spin echo data lines fill the top 10 steps of the central section; the 10 spin echo data lines following the first refocusing pulse fill the next 10 steps, etc. In this manner, the data lines from the fifth spin echo following each shot fall at the center of k-space. The effective echo time (TE) or pseudo echo time is the time from resonance excitation to the fifth spin echo. The preceding and following gradient echoes fill the other two segments analogously. The resonance excitation and data line collection are repeated until k-space is filled in this fashion.

The traditional GSE technique, however, has drawbacks such as the inability to vary the effective or pseudo echo time. The pseudo echo time is set by the echo times of the data lines at the center of the echo train length. In typical GSE sequences, the inability to vary pseudo echo time resulted. Further, traditional GSE sequences suffer from intensity discontinuities at the boundaries of the segments of k-space. This results in severe ghosting in the image. The intensity discontinuities or T2 modulation errors at the boundary are a product of both the ordering scheme in which k-space is filled and the decreasing signal magnitude and thus decreasing signal-to-noise ratio of the echoes over the course of the sequence. As a result, at the boundaries of the segments of k-space, echoes having high signal-to-noise ratios are placed next to echoes having relatively low signal-to-noise ratios.

The present invention is directed to a new and improved magnetic resonance imaging technique which overcomes the above-referenced problems and others.

SUMMARY OF THE INVENTION

In accordance with the present invention, there is provided an apparatus and method for magnetic resonance imaging which phase-encodes a plurality of radio frequency magnetic resonance signals. Data lines generated therefrom are ordered among a plurality of segments of k-space. At least one of the segments of k-space is filled with data lines in a non-sequentially descending order from a top of a segment of k-space to a bottom of the segment of k-space.

In accordance with a more limited aspect of the invention, radio frequency magnetic resonance signals are generated in a plurality of subsequences within a sequence. Each subsequence begins with a refocussing radio frequency pulse followed by a plurality of read gradient reversals to induce n radio frequency magnetic resonance signals. Each of the n radio frequency magnetic resonance signals of the subsequence is assigned to a different one of n segments of k-space. A segment of k-space is filled in with data lines in a non-sequentially descending order from a top of the segment of k-space to a bottom of the segment of k-space based on a temporal order in which the echoes are generated where n is an integer.

In accordance with another limited aspect of the invention, the plurality of radio frequency magnetic resonance signals are phase-encoded such that at a boundary between segments of k-space, one of the radio frequency magnetic resonance signals generated in one of the subsequences traverses k-space immediately adjacent to one of the radio frequency magnetic resonance signals generated in the same subsequence.

In accordance with a more limited aspect of the invention a magnetic resonance imaging sequence has a plurality of subsequences, each comprising a refocussing radio frequency pulse followed by a plurality of read gradient reversals to induce n radio frequency magnetic resonance signals. Each of the n radio frequency magnetic resonance signals of the subsequence is phase-encoded to a different one of n segments of k-space such that, at a boundary between segments of k-space, one of the radio frequency magnetic resonance signals generated in one of the subsequences traverses k-space immediately adjacent to one of the radio frequency magnetic resonance signal generated in a next subsequence.

In accordance with another limited aspect of the present invention, a plurality of radio frequency magnetic resonance signals are phase-encoded such that a temporally first data line of a radio frequency magnetic resonance signal traverses a view of one of the segments of k-space other than a first view at an uppermost portion of the segment of k-space.

One advantage of the present invention is that it provides two-dimensional phase-correction.

Another advantage of the present invention resides in the flexible selection of the effective or pseudo echo time.

Another advantage of the present invention is that it facilitates acquisition of multiple shot image data.

Another advantage of the present invention is that it improves image quality, particularly in terms of Gibbs ringing and distortion.

Another advantage of the present invention is that the technique does not add a significant increase in scan time.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

FIG. 4 is a graphical depiction of the ordering of data lines in k-space; and,

FIG. 5 is an alternate organize of the data lines in k-space to select another pseudo echo time.

DETAILED DESCRIPTION OF THE PREFERRED EMBODIMENTS

Figure 1:
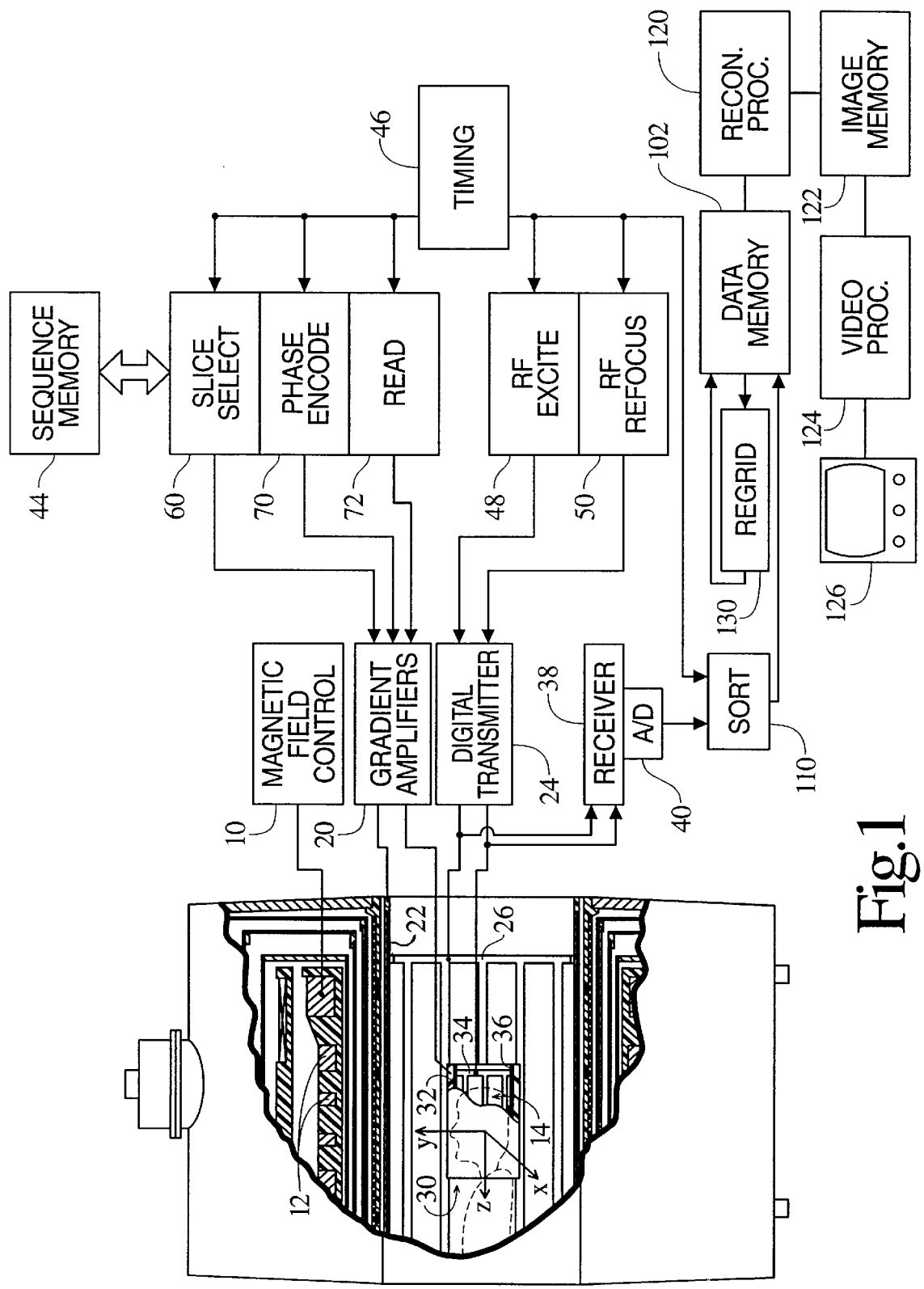
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant magnetic field is created along a z-axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise excite and encode the magnetic resonance, saturate spins, and the like in order to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. A digital radio frequency transmitter 24 transmits radio frequency pulses or pulse packets to a whole body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate spins, excite resonance, invert magnetization, refocus resonance, or manipulate resonance in selected portions of the examination region. For whole body applications, the resonance signals are commonly picked up by the whole body RF coil 26.

For generating images of limited regions of the subject, local coils are commonly placed contiguous to the selected region. For example, an insertable head coil 30 is inserted surrounding a selected brain region at the isocenter of the bore. The insertable head coil 30 preferably includes local gradient coils 32 which receive current pulses from the gradient amplifiers 20 to create magnetic field gradients along x, y, and z-axes in the examination region within the head coil 30. A local radio frequency coil 34 is used to excite magnetic resonance and receive magnetic resonance signals emanating from the patient's head. Alternatively, a receive-only local radio frequency coil can be used to receive resonance signals induced by body-coil RF transmissions. An RF screen 36 blocks the RF signals from the RF head coil from inducing eddy currents in the gradient coils and the surrounding structures. The resultant radio frequency signals are picked-up by the whole body RF coil 26, the local RF coil 34, or other specialized RF coils and demodulated by a receiver 38.

For the selected sequence, the receiver 38 receives a plurality of data lines in rapid succession following each RF excitation pulse. Preferably, the receiver 38 is a digital receiver or, as shown here, is accompanied by an analog-to-digital converter 40 for converting each data line into a digital format.

Figure 2:
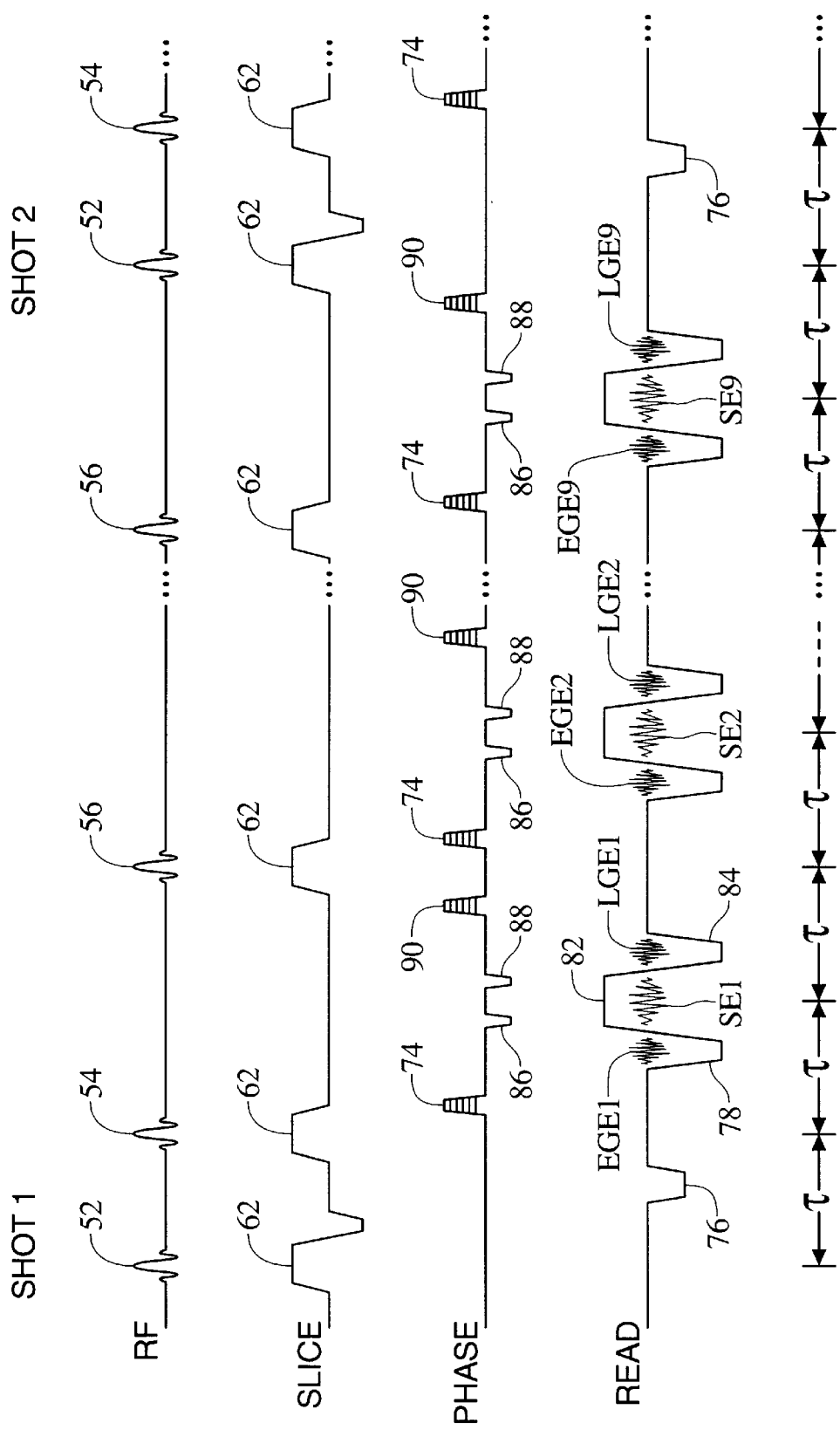
FIG. 2 illustrates a preferred gradient and spin echo imaging sequence.

With continuing reference to FIG. 1 and further reference to FIG. 2, a sequence control circuit 42 controls the gradient pulse amplifiers 20 and the transmitter 24 to generate any of a plurality of pulse sequences loaded from a sequence memory 44 such as the two-dimensional gradient and spin echo imaging sequence illustrated in FIG. 2.

It will be appreciated that other sequences may be used with the present invention such as three-dimensional gradient and spin echo imaging sequences as well as other twoand three-dimensional multiple echo sequences, including echo-planar imaging, echo-volume imaging, and the like.

A clock or timing generator 46 controls an RF excitation pulse generator 48 and a refocusing RF pulse generator 50. The resonance excitation pulse generator 48 controls the radio frequency transmitter to cause a resonance excitation RF pulse 52 to be applied to the imaging region thus initiating a sequence. The refocusing RF pulse generator 50 causes the radio frequency transmitter to generate a refocusing pulse 54, e.g., at a time τ after the excitation pulse thus initiating a subsequence. The excitation pulse followed by a refocusing pulse causes a spin echo SE1 to occur a time 2τ after excitation.

In order to create a repeated echo sequence, the refocusing pulse generator 50 further generates one or more additional refocusing pulses 56 at 2τ time intervals after the preceding refocusing pulse. Each additional refocusing pulse initiates an additional subsequence. In the illustrated sequence, nine refocusing pulses are applied such that nine spin echoes SE1, SE2, SE3, . . . , SE8, SE9, are generated following each excitation pulse 52. Further to the illustrated embodiment, the excitation pulse 52 is applied ten times, denoted as shots 1–10. In this manner, ninety spin echoes are generated.

The timing generator 46 also controls a slice select gradient control 60 which controls the gradient amplifiers 20 to cause slice select gradient pulses 62 concurrently with the RF excitation and refocusing pulses. The slice select gradients are used in a single or multiple-slice examination procedure to limit the excitation to a single slice. Alternately, a slab selection pulse may be applied to limit excitation to a slab that is several slices in thickness. The slab is encoded in three-dimensions with a combination of phase and read gradients.

The timing control further controls a phase-encode gradient controller 70 and a read gradient control 72. The phase-encode gradient controller 70 causes the gradient amplifiers 20 to cause an initial phase-encode gradient 74 with one of a plurality of phase-encode gradient amplitude steps. The read gradient controller causes a first read gradient 76 which is reversed to form an opposite plurality read gradient 78. The gradient reversal induces first early field or gradient echo EGE1. The read gradient is again reversed to apply a read gradient 82 which is centered about the first spin echo SE1. The read gradient is reversed again to an opposite polarity read gradient 84 inducing a first late gradient echo LGE1. The phase-encode gradient amplifier applies phase-encode gradients 86, 88 to change the phase-encoding between the gradient and spin echoes. A phase-unwrapping gradient pulse 90 is equal and opposite to the sum of the phase-encodings applied by phase-encode gradient pulses 74, 86, and 88 such that the net phase-encoding is zeroed prior to application of the next refocusing pulse 56. Again, in the illustrated embodiment nine refocusing pulses are applied to induce a total of nine early and nine late gradient echoes EGE1, EGE2, . . . , EGE8, EGE9, and LGE1, LGE2, . . . , LGE8, and LGE9. Of course, a data line need not be read out at every read gradient reversal.

Figure 3:
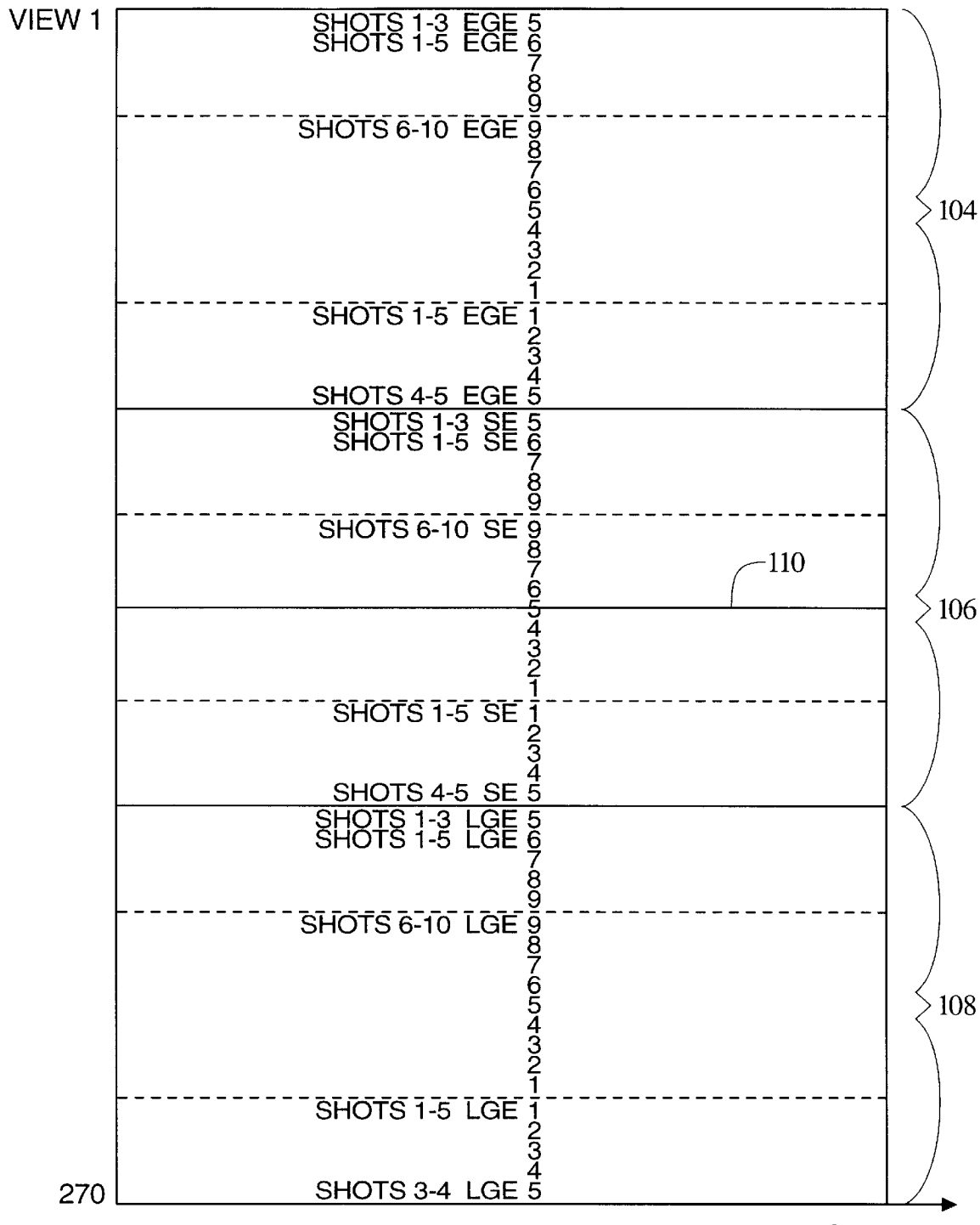
FIG. 3 illustrates organization of data lines in three segments of k-space.

With continuing reference to FIGS. 1 and 2, and further reference to FIG. 3, a sorting routine 100 sorts each of the data lines by shot number and echo position into a data memory 102. More specifically, the amplitude of phase-encode gradient pulses 86 and 88 are selected such that the spin echo, early gradient echo, or late gradient echo have relative phase-encodings that are offset by a third of the total phase-encoding such that the early gradient echoes fall in a first segment 104 at the top third of k-space, the spin echoes fall in a second segment 106 in the middle third of k-space, and the late gradient echoes fall in a third segment 108 at the bottom third of k-space. Of course, other numbers of segments can be selected, particularly when other numbers of echoes are induced or when data is mirrored with conjugate symmetry.

With continuing reference to FIGS. 2 and 3 further reference to FIG. 4, the sorting routine 100 sorts the views such that the early gradient echoes fall in upper segment 104 of k-space, the spin echoes fall in middle segment 106 of k-space, and the late gradient echoes fall in lower segment 108 of k-space. The sorting routine further sorts each of the data lines by echo number or position and shot number or position. In the preferred embodiment, the early gradient echo, the spin echo, and the late gradient echo corresponding to the same shot number and echo position are loaded into the same relative position within their corresponding segment of k-space.

In the illustrated example in which there are ten shots, each followed by nine sets of echoes, and in which the effective or pseudo echo time is to be that of spin echo number 5 (GSE5), the data lines from the fifth set or subsequence of echoes in each of the first two or three shots are loaded in the first two or three positions of each segment. That is, the early gradient echo from the fifth set or subsequence, e.g., EGE5, of each of the first couple of shots is loaded into the first data lines of the upper segment 104. The spin echo from the fifth set or subsequence SE5 from each of the first two or three shots is loaded into the first few lines of the middle segment 106. The late gradient echo from the fifth set or subsequence of echoes LGE5 from each of the first two or three shots is loaded into the first few lines of the lower segment 108. This same process is repeated for the early gradient echo, the spin echo, and the late gradient echo from the sixth set or subsequence of echoes, i.e., EGE6, SE6, LGE6, for each of the first five shots. This process continues incrementing the echo set by one until the last echo set is reached. Thereafter, starting from the last echo set, the echo set starts being decremented by one for each of shots 6–10 until the first echo set is reached. Thereafter, the echo set is again incremented by one for each of the first five shots. Of course, temporally early gradient echo 1 (EGE1) from shot 1 is the first data line generated and collected, even though it is stored about ⅔ of the way down through the first segment of k-space. The incrementing continues ending with the data lines from the fifth set of echoes in the other three or two of the first five shots.

It will be noted that in each of the segments, the echo set starts at 5 and ends at 5. That is, early gradient echoes, e.g., 2 or 3 are disposed on one end of the boundary between segments 104 and 105 and the spin echoes from the fifth set SE5 are located on the other side of the boundary between segments 104 and 106. Similarly, echoes from the fifth set are disposed on opposite sides of the boundary between segments 106 and 108.

The pseudo or effective echo time is determined by the echoes at the center of k-space 110, i.e., at the center of the central section 106. In this example, the spin echoes from the fifth echo set are at the center of k-space. Hence, the pseudo echo time is 10τ.

Typically, k-space has an integer power of two data lines, such as 256. The present example generates 14 extra data lines. Preferably, the extra data lines are redundantly collected at either side of the interface between segments and weightedly combined, e.g., averaged, to improve the amplitude uniformity across the interface between segments.

Preferably, a phase correction is also performed at the interface between segments.

With reference to FIG. 5, it is to be appreciated that with this technique, any of the echo sets can be disposed at the center of k-space such that the pseudo echo time can be any of 2τ, 4τ, 8τ, . . . , 18τ. To change the data line which is at the center of k-space, one merely causes the sorting means to index the view number into which the data lines are loaded by 5, for each shift of one echo set. In the embodiment of FIG. 5, the first spin echoes SE1 are disposed at the center of the central section 106, hence the center of k-space for an effective echo time of 2τ. To achieve this four set shift in echo position, the position in which the data lines are loaded are shifted 20 view numbers to the left (5 shots×4 echo sets). By shifting the loading position, any one of the nine echo sets can be loaded into the center of k-space.

It should further be noted that regardless which echo data is loaded in the center of k-space, the data on either side of the intersections between each of the sections is always the same echo set. Shifting the data which is at the center of k-space shifts the data which is on either side of a boundary interface by the same number of echo sets. Hence, a continuity of echo set across the interface between segments is always maintained.

It is to be appreciated that this same principle applies to sequences having different numbers of echo sets and different numbers of shots per image data set. This technique also applies when there are different numbers of echoes and data lines generated for each echo set. For example, four or other numbers of echoes can be generated in each echo set or subsequence. similarly, by using conjugate symmetry, data from the spin echo can be positioned in the center of k-space by appropriately adjusting the phase-encode gradients and the sorting means. Data from the early gradient echo can be positioned in the next adjacent segment of k-space below the spin echo data by appropriately adjusting the phase-encode pulses and the sorting routine. Data from the late spin echo can be positioned in a next segment below the early gradient echo data by again appropriately adjusting the phase-encoding gradients and the sorting routine. The "missing" data from two symmetric segments to the other side of the spin echo can be generated from the early and late gradient echoes using conjugate symmetry.

Once the data is sorted into the appropriate k-space locations in the data memory 102, a reconstruction processor 120, a Fourier transform reconstruction algorithm or other known reconstruction algorithm reconstructs the data into an electronic image representation that is stored in an image memory 122. A video processor 124 retrieves selected portions of the reconstructed image representation and formats it in appropriate format for display on a human-readable monitor 126, such as a video monitor, active matrix monitor, liquid crystal display, or the like.

In order to combine multiple phase-encoded data lines acquired from different echoes obtained at various echo times into one data area and to form an image free of artifacts, the data is phase corrected by correction circuit 130.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method of magnetic resonance imaging in which a plurality of imaging sequence repetitions are applied to generate a plurality of data lines which are reconstructed into an image representation, in each of the sequence repetitions, resonance is excited followed by the collection of a plurality of sets of data lines, each set including a plurality of data lines, the method further comprising:

in each of a first fraction of the repetitions, phase-encoding the magnetic resonance such that in each subsequent data line set following excitation, the phase-encoding step of the data lines in k-space is incremented relative to the preceding set;

in each of a second fraction of the repetitions, phase-encoding the magnetic resonance such that in each subsequent data line set the phase encoding step of the data lines is decremented in k-space relative to the preceding set; and, sorting the data lines such that the data lines from within each set are sorted among segments of k-space by position within the set such that all first data lines are grouped in a first segment of k-space, all second data lines within each set are grouped in a second segment of k-space, and so forth.

2. The method as set forth in claim 1 further including shifting the phase-encoding steps of the sets such that data lines from a preselected one of the sets falls in a center of k-space, such that a pseudo echo time of the image is selected.

3. The method as set forth in claim 1 wherein the number of repetitions are divided into two groups, each group with a plurality of repetitions.

4. The method as set forth in claim 3 wherein in the first group of repetitions, each data line of a first set is phase-encoded with a first phase-encode step, each data line of a subsequent set is phase-encoded with a larger phase-encode step, and each data line of a next subsequent set is phase-encoded with a yet larger phase-encoding step.

5. The method as set forth in claim 4 wherein in the second group of repetitions, each data line of a first set is phase-encoded with a first phase-encode step, each data line of a subsequent set is phase-encoded with a smaller phase-encode step, and each data line of a next subsequent set is phase-encoded with a yet smaller phase-encoding step.

6. The method as set forth in claim 1 wherein the data lines are further sorted for reconstruction into a plurality of images.

7. A magnetic resonance imaging system in which a magnet for generates a temporally constant magnetic field through an examination region, a radio frequency pulse controller and transmitter induces dipoles in the examination region to resonance such that radio frequency resonance signals are generated, gradient magnetic field coils and a gradient magnetic field controller generate at least phase and read magnetic field gradient pulses in orthogonal directions across the examination region and repeatedly reverse the read gradient, a receiver receives and demodulates the radio frequency magnetic resonance signals after reversal of the read gradient to produce a series of data lines, a reconstruction processor reconstructs the data lines into an image representation and an image memory stores the reconstructed image representation, the magnetic resonance imaging system further comprising:

a phase encode gradient controller for scaling the amplitude of selected phase encode gradient pulses to phase encode a plurality of radio frequency magnetic resonance signals in a magnetic resonance imaging sequence such that data lines generated therefrom are ordered among a plurality of segments of k-space in a non-sequentially descending order from a top of a segment of k-space to a bottom of the segment of k-space based on a temporal order in which the echoes are generated.

8. The magnetic resonance imaging system as set forth in claim 7 further including:

the phase encode gradient controller scaling the amplitude of selected phase encode gradient pulses to phase encode a plurality of radio frequency magnetic resonance signals in a magnetic resonance imaging sequence, the sequence having a plurality of subsequences, each subsequence having a refocussing radio frequency pulse followed by a plurality of read gradient reversals to induce n magnetic resonance echo signals, each of the n magnetic resonance echo signals of the subsequence being phase-encoded to a different one of n segments of k-space, such that a segment of k-space is filled in with data lines in a non-sequentially descending order from a top of the segment of k-space to a bottom of the segment of k-space based on a temporal order in which the echoes are generated, where n is an integer.

9. The magnetic resonance imaging system as set forth in claim 8 further including:

the phase encode gradient controller for scaling the amplitude of selected phase encode gradient pulses to phase encode a plurality of radio frequency magnetic resonance signals in a magnetic resonance imaging sequence such that at a boundary between segments of k-space, one of the radio frequency magnetic resonance signals generated in one of the subsequences traverses k-space immediately adjacent to one of the radio frequency magnetic resonance signals generated in the same subsequence.

10. The magnetic resonance imaging system as set forth in claim 8 further comprising:

the phase encode gradient controller scaling the amplitude of selected phase encode gradient pulses to phase encode a plurality of radio frequency magnetic resonance signals in a magnetic resonance imaging sequence, the sequence having a plurality of subsequences, each subsequence having a refocussing radio frequency pulse followed by a plurality of read gradient reversals to induce n radio frequency magnetic resonance signals, each of the n radio frequency magnetic resonance signals of the subsequence being phase-encoded to a different one of n segments of k-space, such that, at a boundary between segments of k-space, one of the radio frequency magnetic resonance signals generated in one of the subsequences traverses k-space immediately adjacent to one of the radio frequency magnetic resonance signal generated in a next subsequence.

11. The magnetic resonance imaging system as set forth in claim 7 further comprising:

the phase encode gradient scaler for scaling the amplitude of selected phase encode gradient pulses to phase encode a plurality of radio frequency magnetic resonance signals such that a temporally first data line of a radio frequency magnetic resonance signal traverses a view of one of the segments of k-space other than a first view at an uppermost portion of the segment of k-space.

12. A method of magnetic resonance imaging in which magnetic resonance is excited in dipoles which are induced to form radio frequency magnetic resonance signals at each of a plurality of data collection intervals following each resonance excitation, the radio frequency magnetic resonance signals being read out along a read axis in the presence of a read gradient to form a series of data lines for reconstruction into an output image representation, the improvement comprising the steps of:

(a) phase encoding a plurality of radio frequency magnetic resonance signals in a magnetic resonance imaging sequence such that data lines generated therefrom are ordered in one of a plurality of segments of k-space in a non-descending order from a top of the segment of k-space to a bottom of the segment of k-space based on a temporal order in which the radio frequency magnetic resonance and data lines are generated.

13. In the method of claim 12, the improvement further comprising:

(b) exciting magnetic resonance in dipoles to initiate a sequence (c) applying a plurality of refocussing pulse to the dipoles, each refocussing pulse initiating a subsequence;

(d) applying a plurality of alternate polarity read gradients to the dipoles to induce a plurality of n radio frequency magnetic resonance signals within each subsequence;

(e) phase encoding each of n radio frequency magnetic resonance signals within a subsequence to traverse a different one of n segments of k-space;

(f) phase encoding the plurality of radio frequency pulses within the sequence such that a segment of k-space is not filled in with data lines from the radio frequency magnetic resonance signals of the subsequences in an entirely sequentially descending order from a top of the segment of k-space to a bottom of the segment of k-space based on a temporal order in which the echoes are generated.

14. In the method of claim 12, the improvement further comprising:

(g) phase encoding the plurality of magnetic resonance signals such that, at a boundary between segments of k-space, one of the radio frequency magnetic resonance signals generated in one of the subsequences traverses k-space immediately adjacent to one of the radio frequency magnetic resonance signal generated in a next subsequence.

15. In the method of claim 12, the improvement further comprising:

(g) phase encoding the plurality of magnetic resonance signals such that, at a boundary between segments of k-space, one of the radio frequency magnetic resonance signals generated in one of the subsequences traverses k-space immediately adjacent to one of the radio frequency magnetic resonance signal generated in the same subsequence.

16. In the method of claim 12, the improvement further comprising:

(f) phase encoding the plurality of magnetic resonance signals such that a temporal first data line from a radio frequency magnetic resonance signal traverses a view of one of the segments of k-space other than a first view at an uppermost portion of the segment of k-space.

17. A magnetic resonance imaging method comprising:

applying a plurality of imaging sequence repetitions, each repetition generating a plurality of data line sets at a common plurality of temporal set positions within each repetition, a plurality of data lines being generated in each set;

phase-encoding such that the data lines of each set fall into different segments of k-space;

ordering the phase-encoding such that a first and last data line of all segments are collected at a common set position;

reconstructing the data lines into at least one image.

* * * * *